(12) United States Patent
Fuderer et al.

(10) Patent No.: US 11,435,417 B2
(45) Date of Patent: Sep. 6, 2022

(54) RADIO FREQUENCY RECEIVE COIL FOR USE IN MAGNETIC RESONANCE IMAGING SYSTEMS WITH DISCONNECTION WARNING

(71) Applicant: KONINKLIJKE PHILIPS N.V., Eindhoven (NL)

(72) Inventors: Miha Fuderer, Eindhoven (NL); Johannes Matia Van Eggermond, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 128 days.

(21) Appl. No.: 16/654,058

(22) Filed: Oct. 16, 2019

(65) Prior Publication Data

US 2020/0049777 A1 Feb. 13, 2020

Related U.S. Application Data

(63) Continuation of application No. 15/533,397, filed as application No. PCT/EP2015/078650 on Dec. 4, 2015, now Pat. No. 10,473,734.

(30) Foreign Application Priority Data

Dec. 8, 2014 (EP) .............................. EP14196706.7

(51) Int. Cl.
*G01R 33/28* (2006.01)
*G01R 33/341* (2006.01)
*G01R 33/24* (2006.01)
*G01R 33/36* (2006.01)

(52) U.S. Cl.
CPC ......... *G01R 33/288* (2013.01); *G01R 33/341* (2013.01); *G01R 33/36* (2013.01); *G01R 33/3692* (2013.01); *G01R 33/24* (2013.01)

(58) Field of Classification Search
None
See application file for complete search history.

(56) References Cited

U.S. PATENT DOCUMENTS

| | | | |
|---|---|---|---|
| 5,629,622 A * | 5/1997 | Scampini | G01R 33/0206 324/247 |
| 6,542,768 B1 * | 4/2003 | Kuth | A61B 5/02055 324/319 |
| 6,711,434 B2 | 3/2004 | Kramer et al. | |
| 6,961,604 B1 | 11/2005 | Vahasalo et al. | |
| 7,230,425 B2 | 6/2007 | Leussler | |
| 7,821,402 B2 | 10/2010 | Yang et al. | |

(Continued)

FOREIGN PATENT DOCUMENTS

JP 2012245170 A 12/2012

*Primary Examiner* — Douglas X Rodriguez

(57) ABSTRACT

The present invention provides a radio frequency (RF) receive coil device for use in a magnetic resonance (MR) imaging system, comprising a RF receive coil, a plug for connecting the RF receive coil to the MR imaging system, sensing means for sensing the presence of a magnetic field of the MR imaging system, detecting means for detecting if the plug is connected to the MR imaging system, and a warning means for generating a warning when the sensing means sense the presence of a magnetic field of the MR imaging system and the detecting means detect that the plug is not connected to the MR imaging system.

14 Claims, 2 Drawing Sheets

(56) References Cited

U.S. PATENT DOCUMENTS

| | | | |
|---|---|---|---|
| 2006/0232275 A1 | 10/2006 | Leussler | |
| 2009/0128149 A1* | 5/2009 | Greim | G01R 33/288 |
| | | | 324/318 |
| 2009/0149737 A1* | 6/2009 | Hansen | A61B 5/708 |
| | | | 600/421 |
| 2009/0251316 A1* | 10/2009 | Mamourian | G01R 31/318547 |
| | | | 340/540 |
| 2010/0176800 A1 | 7/2010 | Biber et al. | |
| 2012/0112747 A1* | 5/2012 | Alexiuk | G01R 33/288 |
| | | | 324/318 |
| 2013/0271129 A1 | 10/2013 | Kess | |
| 2015/0035534 A1* | 2/2015 | Matschl | G01R 33/34015 |
| | | | 324/318 |
| 2016/0124062 A1 | 5/2016 | Taicher | |

* cited by examiner

RADIO FREQUENCY RECEIVE COIL FOR USE IN MAGNETIC RESONANCE IMAGING SYSTEMS WITH DISCONNECTION WARNING

CROSS-REFERENCE TO RELATED APPLICATIONS

The present application is a continuation application under 37 C.F.R. § 1.53(b) of U.S. patent application Ser. No. 15/533,397 filed Jun. 6, 2017, which is the U.S. National Phase application, under 35 U.S.C. § 371 of International Application No. PCT/EP2015/078650 filed Dec. 4, 2015, which claims the benefit of EP Patent Application No. EP 14196706.7 filed Dec. 8, 2014. Priority under 35 U.S.C. § 120 is claimed from U.S. patent application Ser. No. 15/533, 397, and the entire disclosure of the prior applications are specifically incorporated herein by reference.

FIELD OF THE INVENTION

The invention relates to the field of magnetic resonance imaging (MRI). In particular, the present invention relates to the field of radio frequency (RF) receive coils for use in MRI systems.

BACKGROUND OF THE INVENTION

In order to examine a body of a subject of interest, typically a patient, using magnetic resonance imaging (MRI), different magnetic fields, which are tuned to one another as precisely as possible with respect to their temporal and spatial characteristics, are radiated onto the subject of interest. A powerful main magnet generates a powerful static main magnetic field $B_0$, which typically is provided with a magnetic field strength of 1.5 Tesla or 3 Tesla, in some embodiments with a magnetic field strength of more than 3 Tesla. The subject of interest is typically placed on a vertical support and moved into an approximately homogeneous region of the main magnetic field $B_0$ in a field of view within a bore of the main magnet. The nuclear spins of atomic nuclei of the subject of interest are excited by magnetic radio-frequency excitation pulses $B1$ (x, y, z, t), which are radiated into the nuclei via a radio-frequency antenna and/or a local coil arrangement. Still further, high frequency excitation pulses are generated and guided to the radio-frequency antenna.

The MRI system further includes gradient coils, with which magnetic gradient fields $B_G(x, y, z, t)$ are radiated during a measurement for selective slice excitation and for spatial encoding of the measuring signal. Signals emitted by the excited nuclear spins of the atomic nuclei in the subject of interest to be examined are received by at least RF receive coil, amplified, further processed and digitized. The recorded measured data is digitized and stored as complex numerical values in a k-space matrix. An associated MR image may be reconstructed from the k-space matrix containing the complex numerical values by, for example, a multidimensional Fourier transformation.

Local coils, which are coils not permanently connected to the MR imaging system, are employed according to the use of the MR imaging system. Accordingly, the MR imaging system comprises a socket and the RF receive coil comprises a plug for creating a connection between the local coil and the MR imaging system. When a local coil is introduced in the bore of the MR imaging system, and not connected to the MR imaging system via the plug and the socket, the subject of interest may be endangered or the local coil maybe damaged or even destroyed.

This occurs since MR receive coils are often in a "tuned" state by default. Tuning refers to an adjustment to a desired RF coil frequency used in the MR imaging system for exciting the nuclei of the subject of interest and for receiving MR signals from the nuclei of the subject of interest. As a consequence, very high field strengths during MR-transmit phases of other coils, e.g. the QBC, can be created locally. This is a safety concern, since the applied RF fields can generate high currents in the RF receive coil, which can generate heat, which represents a risk for the subject of interest. Furthermore, these currents are problem for the RF receive coil, since the currents may damage or even destroy the RF receive coil. Furthermore, the presence of not connected RF receive coils in the bore of the MR imaging system may reduce the performance of the MR imaging system, since the currents introduced in the unconnected RF receive coil may result in error signals picked up by other, connected RF receive coils. In that case, if the error is not detected prior to terminating the MR imaging sequence, the MR image data may be entirely lost.

The most relevant measure that prevents the problem, is that the local coil is actively detuned during phases not used for receiving signals, e.g. during transmit phases of other coils. This active detuning requires a signal and power control from the MR imaging system, which provided via the socket and the plug of the RF receiving coil connector and a connection lead to the local coil, i.e. the RF receive coil. Hence, when the RF receive-coil is inserted in the MR imaging system while unconnected, this safety measure cannot be working.

That concern can be mitigated by passive detuning, which will reduce the coil-response during transmit of other coils. This is typically achieved by steering capacitor diodes of the RF receive coil using high DC currents, so that high currents through the RF receive coil can be avoided or at least reduced. Nevertheless, this requires a modified design of the RF receive coil and does not solve the problem of reduced performance of the MR imaging system based on the unconnected RF receive coils in the bore.

In the case that this protection by active and passive detuning fails, fuses may, be installed in the RF receive coil that blow if the HF currents in this local coil are too high to protect the subject of interest and to protect the RF receive coil itself. Nevertheless, when the fuse blows, The RF receive coil is not usable and maintenance by a technician is required to make the RF receive coil usable again.

SUMMARY OF THE INVENTION

It is an object of the invention to provide an RF receive coil device for use in a magnetic resonance (MR) imaging system, that overcomes at least some of the above disadvantages and that provides a high safety for a subject of interest during usage of the MR imaging system and that are protected when unconnected but placed within a bore of the MR imaging system.

This object of the invention is achieved by a radio frequency (RF) receive coil device for use in a magnetic resonance (MR) imaging system, comprising a RF receive coil, a plug for connecting the RF receive coil to the MR imaging system, sensing means for sensing the presence of a magnetic field of the MR imaging system, detecting means for detecting if the plug is connected to the MR imaging system, and a warning means for generating a warning when the sensing means sense the presence of a magnetic field of the MR imaging system and the detecting means detect that the plug is not connected to the MR imaging system. Notably, the sensing means sense the main magnetic field that is generated by the main magnet of the magnetic resonance examination system. The main magnet generates the main magnetic field which is stationary and substantially spatially uniform, in particular in a region around the isocentre of the main magnet. Further, the main magnetic field may have some spatial variations away from the isocentre towards the end(s) of the magnet's bore. Further, the main magnetic field extends as a stray magnetic field beyond the magnet's bore in the examination room in which the main magnet of the magnetic resonance examination system is installed. The main magnetic field generates a net magnetisation in the tissue of the subject to be examined and form this net magnetisation magnetic resonance signals can be acquired. The magnetic resonance image is reconstructed from these magnetic resonance signals. Gradient magnetic fields are usually superposed on the main magnetic field to achieve spatial encoding of the magnetic resonance signals.

Accordingly, a RF receive coil device is proposed that, when sensing the presence of a magnetic field and detecting that it is unconnected, issues a warning with the respective sensing means, detecting means, and warning means. The invention enables to warn an operator using the MR receiver coil is in the magnetic field, i.e. in the bore of the magnetic resonance examination system but not connected. This avoids hazardous situations without the need for active or passive detuning. Accordingly, safety of the subject of interest can be increased. Furthermore, since errors based on the unconnected RF receive coil, it helps to improve the workflow using the MR imaging system. In case an operator forgets to connect the coil during patient setup or to remove a not required coil, valuable system time can be lost before the unconnected coil is detected.

Preferably, the sensing means, the detecting means, and the warning means are completely passive during all normal operation and storage.

The RF receive coil device preferably comprises a control unit for receiving input from the sensing means and the detecting means and for providing an output to the warning means. The control unit can be a separate device, or a device provided integrally with other components of the RF receive coil device. Preferably, the control unit is provided integrally with the warning means.

According to a preferred embodiment, the RF receive coil device comprises an alerting device, which includes the sensing means for sensing the presence of a magnetic field of the MR imaging system, the detecting means for detecting if the plug is connected to the MR imaging system, and the warning means. Hence, the alerting device can be provided as individual device connected e.g. between the RF receive coil and the plug.

The RF receive coil device refers to a local coil, which is not integral part of the MR imaging system, i.e. which is provided depending on different use cases of the MR imaging system. Hence, the local coil can comprise a body coil, a head coil, a knee coil, or any other kind of RF receive coils typically used in MR imaging systems. Furthermore, the RF receive coil can be provided as planar coil, which is located adjacent to a subject of interest, e.g. the subject of interest can be located on top of the planar coil, or as a surrounding coil for surrounding at least a part of the subject of interest, e.g. a head coil for surrounding the head of the subject of interest.

The plug can be a male or female plug depending on the needs for connection to the MR imaging system. Typically, the plug is connected to the RF receive coil with a cord.

According to a preferred embodiment the sensing means for sensing the presence of a magnetic field of the MR imaging system comprise a magnet sensor. Preferably, the magnet sensor is provided as a coil or inductor. Alternatively, the magnet sensor may be a Reed-switch of a Hall-effect sensor. The magnet sensor can sense the presence of a magnetic field, as e.g. the static main magnetic field of a main magnet of the MR imaging system, or a change in magnetic field strength, as e.g. the increase in magnetic field strength when the RF receive coil device is moved into the bore of the MR imaging system. In particular, the coil or inductor provides a current based on changing magnetic fields, notably due to the spatially non uniform stray magnetic field applied thereto.

According to a preferred embodiment the detecting means for detecting if the plug is connected to the MR imaging system comprise voltage detection means for detecting a voltage provided via the plug when connected to the socket of the MR imaging system. Accordingly, when the voltage detection means detect a voltage provided via the plug, this is an indication that the RF receive coil device is connected to the MR imaging system. Also multiple voltages provided via the plug can be monitored to detect if the RF receive coil device is connected to the MR imaging system.

According to a preferred embodiment the warning means for generating a warning comprises an optical warning unit. The optical warning unit is preferably provided as a warning light, further preferred a flashing warning light. The warning light is an indication for an operator of the MR imaging system that the RF receive coil device is not connected to the MR imaging system, so that the operator can remove the RF receive coil device from the MR imaging system or connect the RF receive coil device, if the RF receive coil device is required for operation of the MR imaging system as desired.

According to a preferred embodiment the warning means for generating a warning comprises an acoustic warning unit for generating an acoustic warning. The acoustic warning can be any kind of warning tone, e.g. a typical horn sound used in case of danger. Preferably, the acoustic warning is provided as a fragment of spoken text, which gives a clear indication to a nearby operator in respect to the problem. E.g. the RF receive coil device could inform an operator with a text like "unconnected RF coil device in the bore" or a command like "please remove unconnected RF coil device from MR imaging system". A directly understandable warning has the advantage that the operator does not have to check the cause of the alarm prior to solving the problem.

According to a preferred embodiment the warning means for generating a warning comprises a wireless transmission device for transmitting a warning message. The wireless transmission device is preferably coupled to the MR imaging system to transmit the warning message. Further preferred, the wireless transmission device transmits a warning message, and the MR imaging system is adapted to listen to such warning messages without coupling of the RF receive coil device. Furthermore, the MR imaging system can store such warning messages, which can e.g. be valuable when dealing with customer complaints.

According to a preferred embodiment the RF receive coil device comprises an energy storage unit for providing energy for operation of at least one of the sensing means, the detecting means, and the warning means. The energy storage unit can provide energy to the sensing means, the detecting means, and/or the warning means so that they can be operated independently from an external power supply. Accordingly, the warning can be generated always, as long as energy is provided from the energy storage unit. Preferably, the energy storage unit is removably provided within the RF receive coil device so that in case of the stored energy is consumed, it can be replaced so that the RF receive coil device can be used again without an essential delay for e.g. recharging of the energy storage unit.

According to a preferred embodiment the energy storage unit comprises a battery. The battery is preferably a long life battery, which last for a long time. The higher the expected duration of the battery, the higher is the achievable level of security provided by the RF receive coil device, and the higher is the availability thereof.

According to a preferred embodiment the RF receive coil device comprises an energy harvesting unit for harvesting energy when entered into the MR imaging system, in particular into a bore of the MR imaging system, for operation of the sensing means, the detecting means, and the warning means. The harvesting unit reduces or eliminates the need for an energy storage unit within the RF receive coil device, so that either the energy storage unit can be omitted or the energy storage unit can provide energy for an extended time period.

According to a preferred embodiment the energy harvesting unit for harvesting energy when entered into the MR imaging system comprises at least one induction coil for generating an electric current when a changing magnetic field is applied, and a rectifier for rectifying the electric current generated by the induction coil. Accordingly, upon movement of the RF receive coil device with the energy harvesting unit into the bore of the MR imaging system, the change in the magnetic field at the moving location of the harvesting unit induces a current in the induction coil, which can be used as energy for the operation of the sensing means, the detecting means, and/or the warning means. The rectifier converts the induced current into a DC current. Additionally, a storage capacitor can be provided for smoothing the induced current and for storing harvested energy.

According to a preferred embodiment the energy harvesting unit for harvesting energy when entered into the MR imaging system comprises at least two induction coils for generating an electric current when a changing magnetic field is applied, and at least two rectifiers, one rectifier for rectifying the electric current generated by each of the induction coils, whereby the at least two induction coils are arranged essentially orthogonal to each other. With the at least two induction coils, the energy harvesting unit can be used with reduced or even without caring about the orientation of the RF receive coil device relative to the magnetic field of the main magnet of the MR imaging system. With three induction coils, all orthogonal directions can be fully covered.

According to a preferred embodiment the energy harvesting unit is connected to the energy storage unit for storing harvested energy, and the sensing means, the detecting means, and the warning means are operated from the harvested energy stored in the energy storage unit. Accordingly, the operation of the sensing means, the detecting means, and the warning means can be assured even in cases when the energy harvesting device does not actually harvest sufficient energy. Furthermore, also during normal operation, energy harvesting can be performed. The energy storage unit can comprise e.g. a capacitor, a rechargeable battery, or any other suitable energy storage.

According to a preferred embodiment the RF receive coil device comprises a deactivation circuit for deactivating the sensing means, the detecting means, and the warning means during normal operation and storage. Accordingly, the sensing means, the detecting means, and the warning means can be deactivated during normal operation, i.e. when the RF receive coil device is connected to the MR imaging system when located within the bore thereof, so that the sensing means, the detecting means, and the warning means cannot be damaged or destroyed during operation of the MR imaging system. Further, the sensing means, the detecting means, and the warning means do not interfere operation of the MR imaging system. The deactivation circuit can comprise a circuit for detecting electrical signals or power received via the plug. For storage, the deactivation circuit can comprise a circuit for detecting an orientation of the RF receive coil device. For example, when a planar coil is stored in an upright position, this can be detected by the circuit for detecting an orientation of the RF receive coil device, so that the sensing means, the detecting means, and the warning means do not waste energy in a stand-by state.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
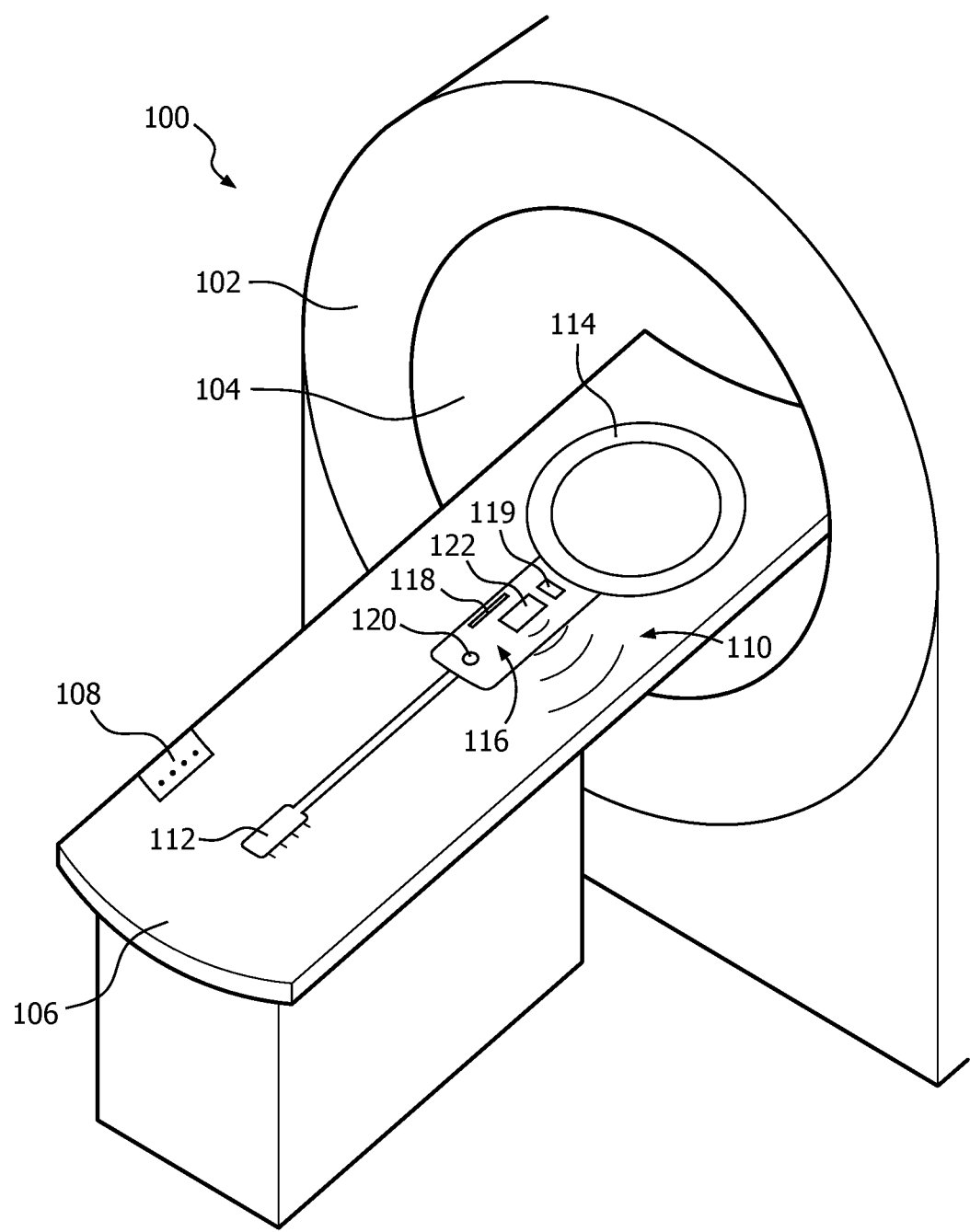
FIG. 1 shows a magnetic resonance imaging system (partially) with a radio frequency receive coil device provided together therewith according to a first embodiment in a perspective view.

A magnetic resonance (MR) imaging system 100 can be seen in FIG. 1. The MR imaging system 100 refers to a conventional MR imaging system 100 as known in the art. Accordingly, the MR imaging system 100 comprises a cylindrical main magnet 102 with a bore 104 provided therein. The main magnet 102 in this embodiment is provided integrally with gradient coils, which are not shown separately in the figure. The MR imaging system 100 further comprises a support 106 for laying a subject of interest thereon.

As can be seen in FIG. 1, the support 106 is provided with a socket 108 connecting thereto a radio frequency (RF) receive coil device 110. The RF receive coil device 110 is placed on top of the support 106.

The RF receive coil device 110 comprises a RF receive coil 114, a plug 112 for connecting the RF receive coil 114 to the MR imaging system 100, and an alerting device 116. The plug 112 is provided for connection to the socket 108 of the support 106 of the MR imaging system 100. The RF receive coil device 110 is provided as a local coil in this embodiment, which is not integral part of the MR imaging system 100, and which is in this embodiment provided with a planar RF receive coil 114.

The alerting device includes sensing means 118 for sensing the presence of a magnetic field of the MR imaging system 100, detecting means 119 for detecting if the plug 112 is connected to the socket 108 at the support 106 of the MR imaging system 100, and warning means 120, 122 for generating a warning when the sensing means 118 sense the presence of a magnetic field of the MR imaging system 100 and the detecting means 119 detect that the plug 112 is not connected to the MR imaging system 100. In this embodiment, the alerting device 116 is provided as individual device connected between the RF receive coil 114 and the plug 112.

The sensing means 118 according to this embodiment comprise a magnet sensor, which is provided as a magnetic coil. The magnet sensor senses the presence of a magnetic field, as e.g. the static main magnetic field of a main magnet 102 of the MR imaging system 100, or a change in magnetic field strength, as e.g. the increase in magnetic field strength when the RF receive coil device 110 is moved into the bore 104 of the MR imaging system 100.

The detecting means 119 according to this embodiment comprise voltage detection means for detecting a voltage provided via the plug 112 when connected to the socket 108 of the MR imaging system 100. Accordingly, when the voltage detection means detect a voltage provided via the plug 112, this is an indication that the RF receive coil device 110 is connected to the MR imaging system 100.

In this embodiment the warning means 120, 122 comprise an optical warning unit 120, which is provided as a flashing warning light. The optical warning unit 120 provides an indication for an operator of the MR imaging system 100 that the RF receive coil device 110 is not connected to the MR imaging system 100, so that the operator can remove the RF receive coil device 110 from the MR imaging system 100 or properly connect the RF receive coil device 110, if the RF receive coil device 110 is required for a desired operation of the MR imaging system 100.

In this embodiment the warning means 120, 122 further comprise an acoustic warning unit 122 for generating an acoustic warning. The acoustic warning is provided in this embodiment as a fragment of spoken text, which gives a clear indication to a nearby operator in respect to the problem. In this embodiment the acoustic warning unit 122 acoustically provides a spoken command like "please remove unconnected RF coil device from MR imaging system".

In this embodiment the warning means 120, 122 further comprise a wireless transmission device for transmitting a warning message, which is in this embodiment provided integrally with the acoustic warning device 122. The wireless transmission device is transmits a warning message, and the MR imaging system 100 is adapted to listen to such warning messages without coupling of the RF receive coil device 110.

Figure 2:
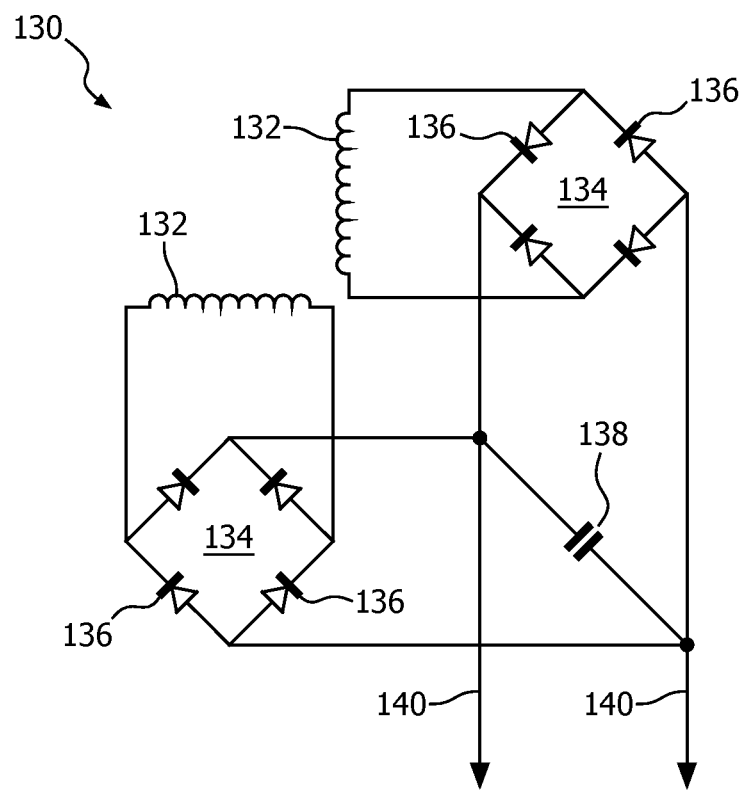
FIG. 2 shows a harvesting device of the RF receive coil device of FIG. 1 in a schematic view.

In this embodiment the alerting device 116 comprises an energy harvesting unit 130 for harvesting energy when entered into the MR imaging system 100. The energy harvesting unit 130 is shown alone in FIG. 2. The energy harvesting unit 130 comprises two induction coils 132 for generating an electric current when a changing magnetic field is applied, and two rectifiers 134, one rectifier 134 for rectifying the electric current generated by each of the induction coils 132. The two induction coils 132 are arranged essentially orthogonal to each other. Accordingly, upon movement of the RF receive coil device 110 with the energy harvesting unit 130 into the bore 104 of the MR imaging system 100, the change in the magnetic field at the moving location of the energy harvesting unit 130 induces a current in at least one of the induction coils 132. The induced current is rectified by diodes 136 of the rectifiers 134 into a DC current and provided to storage capacitor 138, which smoothes the induced current and serves as energy storage unit 138. Cables 140 of the energy harvesting unit 130 are connected to the alerting device 116 so as to provide energy to the alerting device 116 for operation of the sensing means 118, the detecting means 119, and the warning means 120, 122.

The RF receive coil device 110 is configured so that, when sensing the presence of a magnetic field with the sensing means 118 and detecting with the detecting means 119 that RF receive coil device 110 is not connected to the MR imaging device 110, a warning is issued with the warning means 120, 122.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A device comprising:
    a first port coupled to an associated RF coil and a second port coupled to an associated plug of an associated magnetic resonance (MR) imaging system;
    a sensor configured to detect presence of a main magnetic field generated by an associated main magnet of the MR imaging system;
    a detector coupled to the second port, the detector configured to detect if the plug is connected to the associated MR imaging system;
    a warning unit configured to generate a warning of a safety or equipment damage hazard when the sensor detects the presence of the main magnetic field generated by the main magnet and the detector detects that the plug is not connected to the MR imaging system; and
    a housing to enclose the sensor, the detector, and the warning unit in a single device, the housing being disposed on the associated RF coil.

2. The device of claim 1, wherein the first port and the second port are accessible through the housing for connecting the device between the associated RF coil and the associated MR imaging system.

3. The device of claim 1, wherein the sensor comprises an induction coil.

4. The device of claim 1, wherein the sensor comprises a Reed-switch of a Hall-effect sensor.

5. The device of claim 1, further comprising a battery configured to provide energy for operation of at least one of the sensor, the detector, and the warning unit.

6. The device of claim 5, further comprising an energy harvesting unit for harvesting energy when entered into a bore of the MR imaging system for operation of at least one of the sensor, the detector, and the warning unit.

7. The device of claim 6, wherein the energy harvesting unit comprises at least one induction coil for generating an electric current when a changing magnetic field is applied, and a rectifier for rectifying the electric current generated by the at least one induction coil.

8. The device of claim 6, wherein the energy harvesting unit includes an energy storage unit comprising a battery.

9. The device of claim 1, further comprising a deactivation circuit for deactivating the sensor, the detector and the warning unit during normal operation when the plug does connect the RF receive coil to the MR imaging system when the RF receive coil is located within a bore of the MR imaging system.

10. The device of claim 1, wherein the warning unit is configured to generate an acoustic warning.

11. The device of claim 1, wherein the warning unit is configured to generate an optical warning.

12. The device of claim 1, wherein warning unit includes a wireless transmitter for transmitting a warning message.

13. The device of claim 1, wherein the detector is configured to detect if the plug is connected to the associated MR imaging system by detecting whether a voltage is provided by a connection of the second port to the associated plug of the associated MR imaging system.

14. The device of claim 1, wherein the sensor comprises a magnet sensor.

* * * * *